United States Patent
Brask et al.

(10) Patent No.: US 6,746,967 B2
(45) Date of Patent: Jun. 8, 2004

(54) ETCHING METAL USING SONICATION

(75) Inventors: Justin K. Brask, Portland, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/260,591

(22) Filed: Sep. 30, 2002

(65) Prior Publication Data

US 2004/0061199 A1 Apr. 1, 2004

(51) Int. Cl.$^7$ .............................................. H01L 21/302
(52) U.S. Cl. ......................................... 438/752; 130/10
(58) Field of Search .............................. 438/752; 134/10

(56) References Cited

U.S. PATENT DOCUMENTS

| | | | |
|---|---|---|---|
| 4,681,657 A | 7/1987 | Hwang et al. | 156/657 |
| 5,057,184 A | 10/1991 | Gupta et al. | 156/637 |
| 5,674,758 A | 10/1997 | McCarthy | 437/21 |
| 5,817,580 A * | 10/1998 | Violette | 438/756 |
| 6,090,721 A * | 7/2000 | Yates | 438/745 |
| 6,140,221 A | 10/2000 | Annapragada et al. | 438/622 |
| 6,143,087 A * | 11/2000 | Walter | 134/1 |
| 6,146,468 A * | 11/2000 | Dryer et al. | 134/10 |
| 6,261,978 B1 | 7/2001 | Chen et al. | 438/981 |
| 6,303,418 B1 | 10/2001 | Cha et al. | 438/199 |
| 6,331,493 B1 | 12/2001 | Sharan | 438/765 |
| 6,333,268 B1 * | 12/2001 | Starov et al. | 438/691 |
| 6,348,101 B1 * | 2/2002 | Walter | 134/1 |
| 6,358,670 B1 | 3/2002 | Wong et al. | 430/296 |
| 6,514,881 B1 | 2/2003 | Coffman | 438/780 |
| 6,596,467 B2 | 7/2003 | Gallagher et al. | 430/314 |
| 6,596,627 B2 | 7/2003 | Mandal | 438/622 |
| 6,599,840 B2 * | 7/2003 | Wu et al. | 438/705 |
| 6,602,802 B2 | 8/2003 | Aoi | 438/778 |
| 6,602,804 B2 | 8/2003 | Allen et al. | 438/780 |

OTHER PUBLICATIONS

Peter Van Zant, "Microchip Fabrication, A Practical Guide To Semiconductor Processing",(McGraw Hill) 2000 pp. 127, 514–515.
U.S. patent application Ser. No. 10/209,843 entitled "Generating Nitride Waveguides," filed Jul. 31, 2002.
U.S. patent application Ser. No. 10/210,461 entitled "Selective Etching Of Polysilicon," filed Jul. 31, 2002.
U.S. patent application Ser. No. 10/242,740 entitled "Selective Etching Using Sonication," filed Sep. 12, 2002.
U.S. patent application Ser. No. 10/274,446 entitled "Protective Delicate Semiconductor Features During Wet Etching," filed Oct. 15, 2002.
U.S. patent application Ser. No. 10/272,624 entitled "Wet Etching Narrow Trenches," filed Oct. 17, 2002.
U.S. patent application Ser. No. 10/395,447 entitled "Forming A Porous Dielectric Layer," filed Mar. 24, 2003.
U.S. patent application Ser. No. 10/692,696 entitled "Epitaxially Deposited Source/Drain," filed Oct. 24, 2003.

* cited by examiner

*Primary Examiner*—John F. Niebling
*Assistant Examiner*—Olivia T. Luk
(74) *Attorney, Agent, or Firm*—Trop, Pruner & Hu, P.C.

(57) ABSTRACT

A technique in accordance with the invention includes obtaining a semiconductor structure that has a metal disposed thereon. At least a portion of the metal is etched using an etching fluid while sonic energy is applied to the etching fluid.

41 Claims, 4 Drawing Sheets

(PIOR ART)

(PIOR ART)

(PIOR ART)

ETCHING METAL USING SONICATION

BACKGROUND

The invention generally relates to etching metal using sonication.

In a variety of different circumstances, it may be desirable to selectively etch metal in the formation of a semiconductor device. For example, the etching of metal may be related to the formation of a metal silicide layer (a nickel silicide layer, for example), a layer used to reduce metal-to-semiconductor contact resistances in a semiconductor device.

To form a metal silicide layer, a metal layer (nickel, for example) typically is deposited on a semiconductor structure. In this manner, the deposited metal reacts with exposed silicon of the structure to form the metal silicide layer. Not all of the deposited metal layer typically reacts. In this manner, the regions in which the metal layer does not react form excess or un-reacted metal regions that typically are removed by wet etching. As a more specific example, FIG. 1 depicts a semiconductor structure 9 that represents a particular stage in a process to form a complimentary metal oxide semiconductor (CMOS) transistor. For this example it is assumed that the CMOS transistor is formed on a silicon substrate 12. As shown in FIG. 1, the polysilicon layer 18 resides on top of a gate oxide layer 16, and vertically extending nitride spacers 20 may be located on either side of the polysilicon layer 18.

For purposes of creating a nickel silicide layer, a nickel layer 22 may be blanket deposited over existing layers of the structure 9. As depicted in FIG. 1, the deposited nickel layer 22 extends over portions of the silicon substrate 12 as well as extends over a polysilicon layer 18. The regions in which the nickel layer 22 contacts the silicon substrate 12 form parts of the source and drain of the transistor, and the region in which the nickel layer 22 contacts the polysilicon layer forms part of the gate of the transistor in this example.

Thus, the deposited nickel layer 22 contacts the polysilicon layer 18 and the silicon substrate 12, and in these contacted regions, the nickel layer 22 reacts with the polysilicon layer 18 and the silicon substrate 12 to form the nickel silicide layer that extends into regions 26 of a resulting structure 10 that is depicted in FIG. 2. As a more specific example, a particular nickel silicide region 26a may be associated with a drain of the transistor, another nickel silicide region 26b may be associated with a source of the transistor, and another nickel silicide region 26c may be associated with a gate of the transistor.

The deposited nickel does not react everywhere, leaving regions 24 of excess or unreacted nickel. To remove these regions 24, selective wet etching is used to target the nickel but not other substances (such as nickel silicide, for example) to remove the nickel to form a structure 11 that is depicted in FIG. 3. Thus, after the selective wet etching, the unreacted nickel portions 24 (see FIG. 2) are removed, leaving only the regions 26 of nickel silicide film, as depicted in FIG. 3.

The wet etching typically involves submersing a wafer that contains the structure 10 into a nickel selective etchant, or etching fluid, that typically includes both an acid, such as sulfuric acid, and an oxidant, such as hydrogen peroxide or nitric acid. At room temperature, the use of sulfuric acid by itself to etch the nickel is not sufficient due to the potential energy barrier that prevents the oxidation of the nickel in accordance with the Pourbaix chart for nickel. Therefore, an oxidant typically is introduced into the etching fluid to supply the needed energy to oxidize the nickel into an aqueous derivative and thus, dissolve the nickel.

For certain semiconductor devices, an oxidant in the etching fluid may undesirably oxidize and thus, etch substances that are not meant to be etched. For example, elemental germanium substrates, germanium-doped silicon substrates and germanide films are examples of germanium-based substances that typically are highly susceptible to oxidants that are used in the etching of nickel. The etch rates for these germanium substances may be the same or even higher than the etch rate for nickel in the presence of such an oxidant. Therefore, when germanium-based substances are present, the use of conventional etching fluid to etch nickel may undesirably dissolve significant portions of these germanium-based substances.

Thus, there is a continuing need for a better way to selectively etch metal that is disposed on a semiconductor structure that contains certain semiconductor substrates, films and/or layers.

DETAILED DESCRIPTION

Germanium-based substances (herein called "germanium substances"), such as germanide films, germanium-doped regions and elemental germanium substrates, may be highly susceptible to the etchant, or etching fluid, that is conventionally used to etch nickel. In this manner, a typical etching fluid for nickel contains an acid, such as sulfuric acid, and an oxidant, such as hydrogen peroxide or nitric acid, which are highly oxidizing in nature. Although this etching fluid may be used in a standard silicon-based process, the etching fluid undesirably etches germanium substances because germanium is highly soluble in a low pH, aqueous solution that contains an oxidant (hydrogen peroxide or nitric acid, as examples).

Thus, if such an oxidant-containing etching fluid is used to etch nickel that is disposed on a semiconductor structure that includes germanium substances, the germanium substances maybe undesirably dissolved. However, an etching fluid that lacks an oxidant is not by itself sufficient to etch nickel due to the potential energy barrier that exists for dissolving nickel (i.e., oxidizing nickel to some aqueous nickel derivative) in a low pH solution. To address this problem, an embodiment of a technique in accordance with the invention overcomes the potential energy barrier by applying sonic energy to an oxidant-free etching fluid. Thus, with the application of sonic energy to oxidant-free etching fluid during etching of nickel, the nickel may be selectively etched while germanium substance(s) of the semiconductor structure remain intact.

Figure 1:
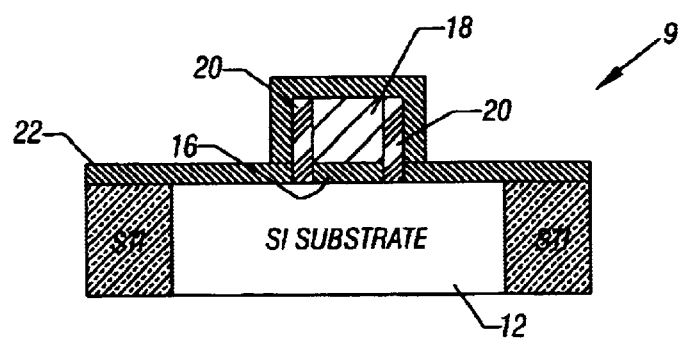
FIGS. 1, 2 and 3 are cross-sectional views of semiconductor structures depicting different stages in the formation of a semiconductor device according to the prior art.
Figure 2:
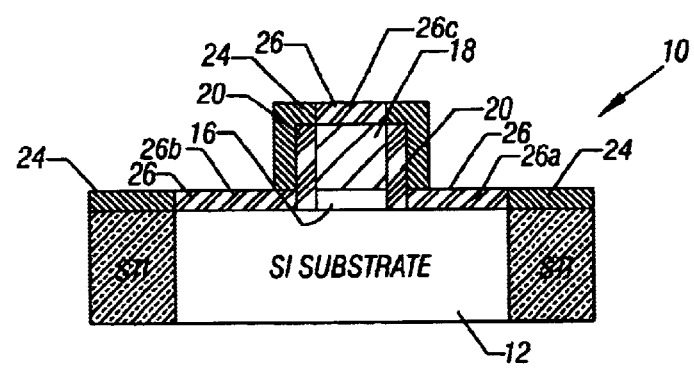
Figure 3:
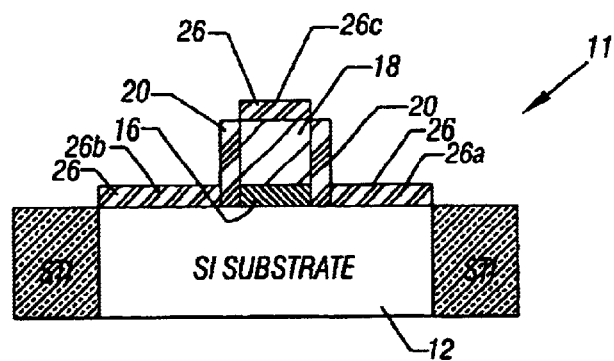
Figure 4:
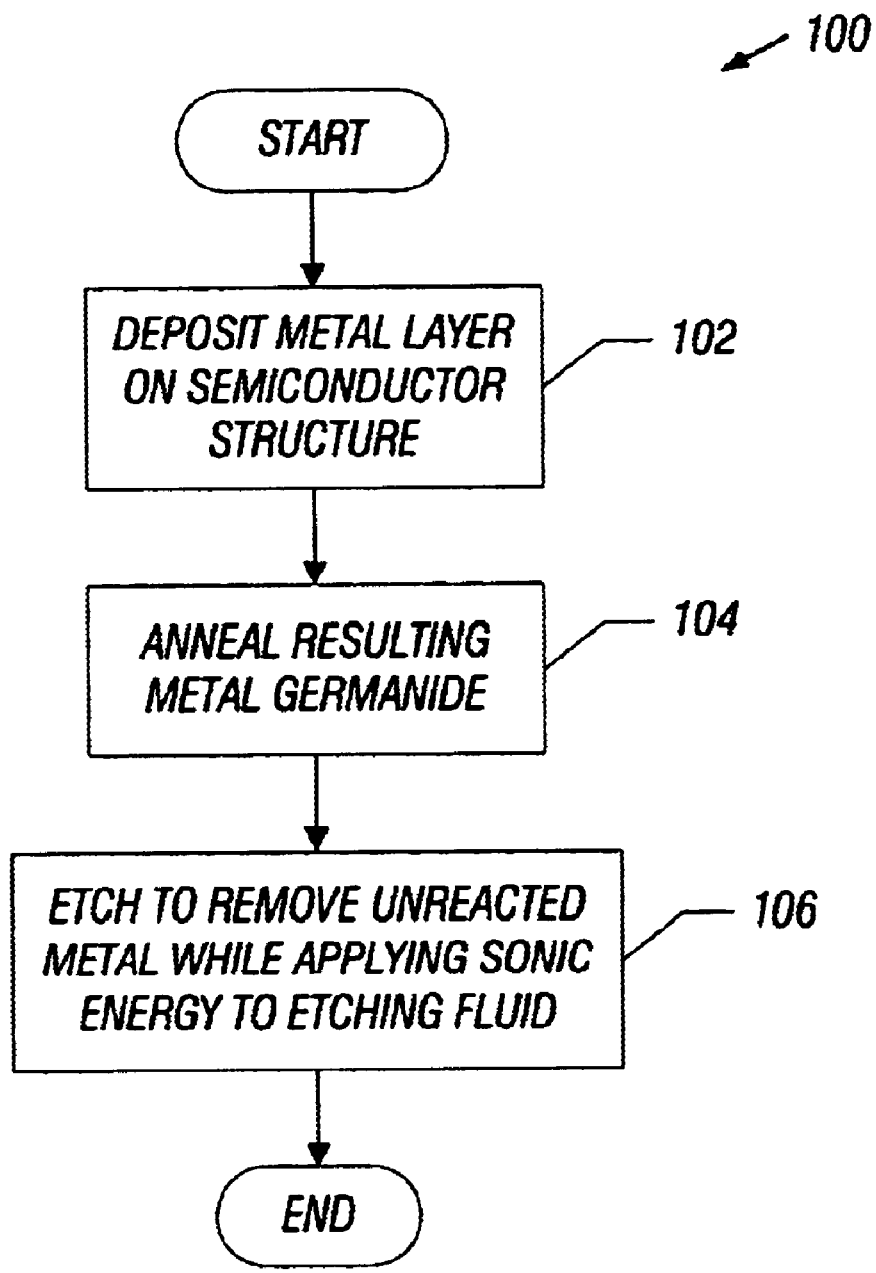
FIG. 4 is a flow diagram depicting a technique to form a semiconductor structure according to an embodiment of the invention.

Therefore, referring to FIG. 4, an embodiment 100 of a technique in accordance with the invention includes depositing (block 102) a metal layer on a semiconductor structure. This metal layer may be, for example, a nickel layer, that reacts with germanium regions of the structure to form a nickel germanide film, or layer. This nickel germanide layer, in turn, may be located between germanium substances of the structure and source and drain metal contacts for purposes of reducing contact resistances between the germanium substances and these contacts. The nickel layer may also be deposited for purposes of forming a nickel silicide layer between a polysilicon layer and a gate metal contact for purposes of reducing a contact resistance between the polysilicon layer and the gate metal contact.

After the metal layer to form the germanide layer (and possibly a silicide layer) is deposited in accordance with the technique 100, the resulting metal germanide and silicide regions are annealed, as depicted in block 104. Subsequently, in accordance with the technique 100, the structure is selectively wet etched with an oxidant-free etchant, or etching fluid, to remove the excess or unreacted metal regions (unreacted or excess nickel regions, for example) while sonic energy is applied to the etching fluid to supply sufficient energy to facilitate oxidation of the metal being etched, as depicted in block 106. The etching fluid may include sulfuric acid, for example. Due to the lack of an oxidant in the etching fluid, undesirable etching of germanium substances of the structure does not occur.

Figure 5:
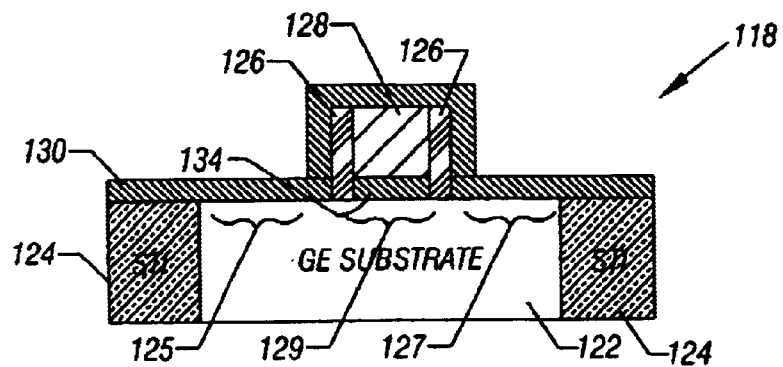
FIGS. 5, 6, 7 and 8 are cross-sectional views of semiconductor structures in accordance with embodiments of the invention depicting different stages in the formation of a semiconductor device.

As a more specific example, FIGS. 5, 6, 7 and 8 depict semiconductor structures that represent different stages in the formation of a CMOS transistor, in accordance with some embodiments of the invention. More specifically, FIG. 5 depicts a semiconductor structure 118, in accordance with an embodiment of the invention, that is formed on a germanium substrate 122. The substrate 122 may be an elemental germanium substrate. Alternatively, the substrate 122 may be a silicon substrate that is doped with germanium in the source and drain regions of the transistor.

Regardless of how the germanium is introduced, the germanium substrate 122 includes a first region 125 that may be associated with a source of the transistor and another region 127 that may be associated with a drain of the transistor. The germanium substrate 122 is isolated on either side by insulating oxide regions 124.

The germanium substrate 122 may also include a region 129 that is associated with a gate of the transistor. A gate oxide layer 134 is deposited directly on the germanium substrate 122 on the gate region 129, and a polysilicon layer 128 is formed on top of the gate oxide layer 134. Nitride spacers 126 may extend upwardly on either side of the polysilicon layer 128. Alternatively, the polysilicon layer 128 may be replaced by a germanium-based, germaniun-silicon-based or metal-based layer, as just a few examples.

As depicted in FIG. 5, a layer 130 of nickel is blanket deposited on the structure 118 and covers the otherwise exposed germanium substrate 122 and the otherwise exposed polysilicon layer 128. Reactions occur with the nickel to form a structure 119 that is depicted in FIG. 6.

Figure 6:
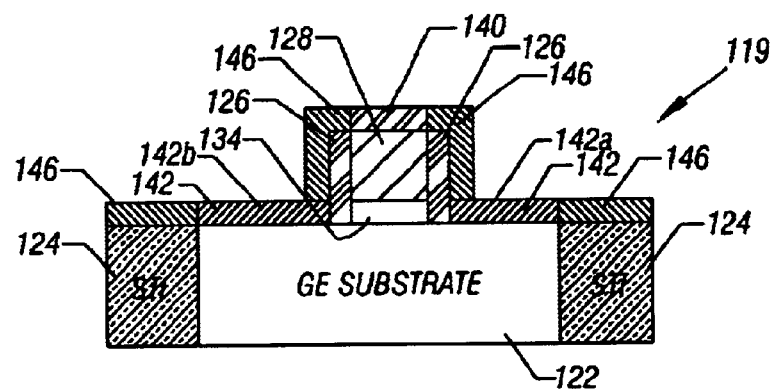

Referring to FIG. 6, in this manner, the nickel reacts with the exposed polysilicon 128 and the exposed germanium substrate 122 to form nickel germanide regions 142 over the exposed germanium substrate 122 and a nickel silicide region 140 over the exposed polysilicon layer 128. Thus, the nickel silicide region 140 is formed from the reaction of silicon (in the polysilicon layer 128) with the nickel, and the nickel germanide regions 142 are formed by the reaction of germanium (in the germanium substrate 122) with the nickel. Therefore, the reactions with the deposited nickel layer 130 form one nickel germanide region 142a that is associated with the drain of the transistor, another nickel germanide region 142b that is associated with source of the transistor and the nickel silicide region 140 that is associated with the gate of the transistor.

As illustrated in FIG. 6, not all of the nickel reacts, thereby leaving unreacted or excess nickel regions, such as the depicted regions 146. A next step in the process to form the transistor may be the annealing of the nickel silicide region 140 and the nickel germanide regions 142a and 142b. After the annealing, the structure 119 is selectively wet etched in an oxidant-free etchant, or etching fluid, such as sulfuric acid, for example. During this etching, sonic energy (in lieu of the inclusion of an oxidant in the etching fluid) is applied to the etching fluid for purposes of overcoming the high energy barrier that is associated with the dissolution of nickel in solutions of low pH.

As a more specific example, in some embodiments of the invention, ultrasonic sonic energy in the frequency range between approximately 10 kilohertz (kHz) and 100 kHz may be applied to the etching fluid during the etching of the unreacted nickel. Alternatively, in some embodiments of the invention, megasonic energy in the range of approximately 500 to 1000 kHz may be applied to the etching fluid during the etching of the nickel. The sonic energy may be applied via transducers that are located in, on or near an immersion tank in which the structure 119 is immersed and the wet etching is performed.

Figure 7:
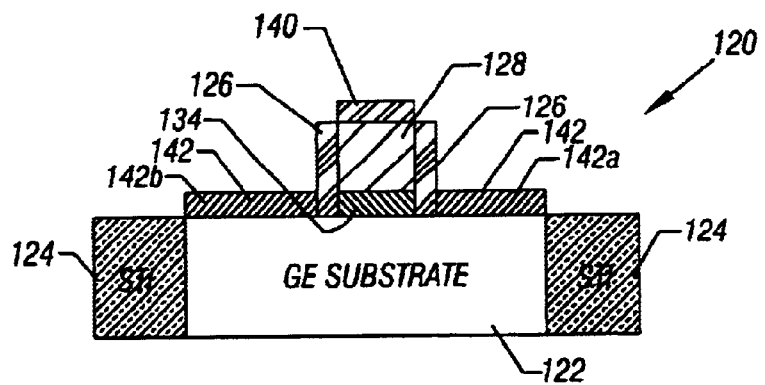

The result of the etching is a structure 120 that is depicted in FIG. 7. In this manner, the etching removes the unreacted nickel regions 146 (FIG. 6) to leave the nickel silicide region 140 located above the polisilicon layer 128 and the nickel germanide regions 142a and 142b of the drain and source regions, respectively.

Figure 8:
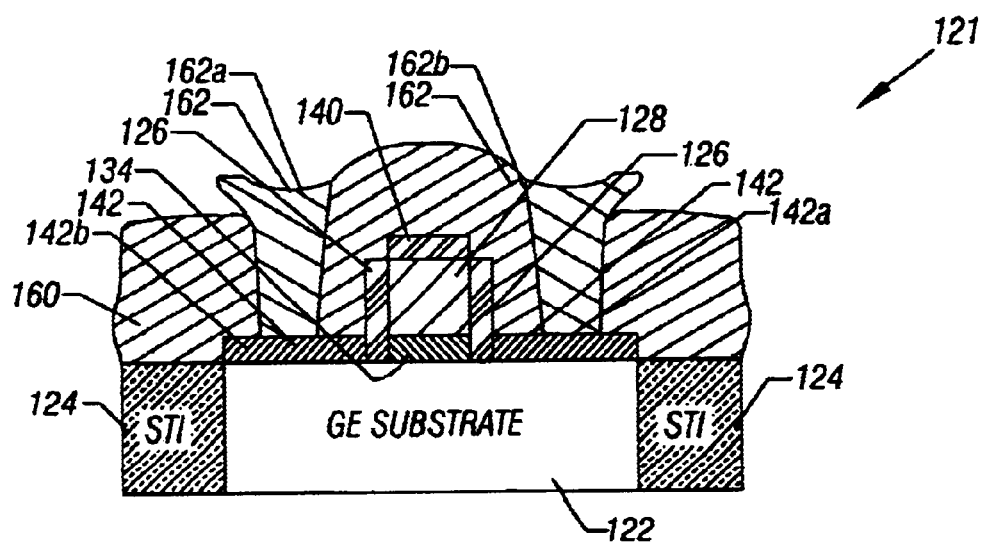

Many other steps may be performed in the process to form the transistor from the structure 120. As an example of one out of possibly many more steps that may be performed, in some embodiments of the invention, an oxide layer 160 may be subsequently deposited on the structure 120 to form a structure 121 that is depicted in FIG. 8. The oxide layer 160 is polished back and then selective etching is performed to create contact holes so that a metal layer may be deposited to form corresponding transistor contacts 162 with the germanide and silicide films. For example, as depicted in FIG. 8, the structure 121 may include a source metal contact 162a that extends through a contact hole in the oxide layer 160 to the nickel germanide region 142b, and the structure 121 may include a drain metal contact 162b that extends through another contact hole in the oxide layer 160 to contact the nickel germanide region 142a. A gate metal contact may be also formed to the nickel silicide region 140, although such a contact is not depicted in the cross-section illustrated in FIG. 8.

Thus, due to the intervening nickel germanide and silicide layers, contact resistances are decreased between upper metal layers and the germanium substrate 122 and polysilicon layer 128. As an example, tungsten may be used to form the metal contacts 162. Other metals may be used.

In the context of this application, although the preceding description may have used such terms as "over" and "on" to describe the relative positions or locations of certain substances, materials or layers these terms do not necessarily mean that the substances, materials or layers contact each other, unless otherwise stated.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:

obtaining a semiconductor structure having a metal disposed thereon; and etching at least a portion of the metal using an etching fluid while applying sonic energy to the etching fluid.

2. The method of claim 1, further comprising:

depositing a metal layer on the structure, the deposited metal layer forming reacted and unreacted metal regions, wherein the etching comprises etching at least a portion of the unreacted metal regions.

3. The method of claim 1, wherein the obtaining comprises obtaining a semiconductor structure having a region containing germanium.

4. The method of claim 3, wherein the obtaining comprises obtaining a semiconductor structure having nickel disposed thereon, and the etching comprises etching at least a portion of the nickel while applying sonic energy to the etching fluid.

5. The method of claim 1, wherein the obtaining comprises obtaining a semiconductor structure having nickel disposed thereon, and the etching comprises etching at least a portion of the nickel while applying sonic energy to the etching fluid.

6. The method of claim 1, wherein the obtaining comprises obtaining a semiconductor structure having a germanium region and nickel disposed over the substrate.

7. The method of claim 1, wherein the applying the sonic energy comprises applying ultrasonic energy.

8. The method of claim 1, wherein the applying sonic energy comprises applying megasonic energy.

9. The method of claim 1, wherein the etching comprises etching without using an oxidant in the etching fluid.

10. A method comprising:

obtaining a semiconductor structure having nickel disposed thereon and a region containing germanium; and etching at least some of the nickel using an etching fluid while applying sonic energy to the etching fluid.

11. The method of claim 10, further comprising:

depositing the nickel on the semiconductor structure to form nickel germanide in at least one region and unreacted nickel in another region; and etching to remove at least some of the unreacted nickel.

12. The method of claim 10, wherein the obtaining comprises obtaining a semiconductor structure having a germanium substrate.

13. The method of claim 1, wherein the obtaining comprises obtaining a semiconductor structure having a silicon substrate having at least one germanium region.

14. The method of claim 10, wherein the etching comprises etching without using an oxidant in the etching fluid.

15. The method of claim 10, wherein the applying the sonic energy comprises applying ultrasonic energy.

16. The method of claim 10, wherein the applying sonic energy comprises applying megasonic energy.

17. A method comprising:

obtaining a semiconductor structure having a germanium region and a metal disposed on the semiconductor structure; and etching at least a portion of the metal while applying sonic energy to an etching fluid.

18. The method of claim 17, further comprising:

depositing a metal layer on the semiconductor structure to form a metal germanide in a first region and unreacted metal in a second region, wherein the etching comprises etching at least a portion of the second region.

19. The method of claim 17, wherein the obtaining comprises obtaining a semiconductor structure having a germanium substrate.

20. The method of claim 17, wherein the obtaining comprises obtaining a semiconductor structure having a silicon substrate having a germanium region.

21. The method of claim 17, wherein the applying the sonic energy comprises applying ultrasonic energy.

22. The method of claim 17, wherein the applying the sonic energy comprises applying megasonic energy.

23. A method comprising:

obtaining a semiconductor structure having a region capable of being dissolved by a first etching fluid that includes an oxidant; and etching at least a portion of a layer deposited on the substrate using a second etching fluid that does not include the oxidant while applying sonic energy to the second etching fluid.

24. The method of claim 23, wherein the obtaining comprises obtaining a substrate having a germanium region capable of being dissolved by the first etching fluid.

25. The method of claim 23, wherein the application of the sonic energy provides energy to dissolve said at least a portion of the layer.

26. The method of claim 23, wherein the applying the sonic energy comprises applying ultrasonic energy.

27. The method of claim 23, wherein the applying the sonic energy comprises applying megasonic energy.

28. The method of claim 23, wherein the etching at least a portion of a layer comprises etching at least a portion of a metal layer.

29. The method of claim 23, wherein the etching at least a portion of a layer comprises etching at least a portion of a nickel layer.

30. A method comprising:

etching at least some of a metal disposed on a semiconductor structure using an oxidant-free etching fluid; and applying sonic energy to the etching fluid while etching.

31. The method of claim 30, wherein the etching comprises etching nickel.

32. The method of claim 30, wherein the etching comprises etching metal disposed on a semiconductor structure comprising a germanium region.

33. The method of claim 30, wherein the applying the sonic energy comprises applying ultrasonic energy.

34. The method of claim 30, wherein the applying the sonic energy comprises applying megasonic energy.

35. A method comprising:

obtaining a germanium substrate having a metal disposed thereon; and etching at least a portion of the metal using an etching fluid while applying sonic energy to the etching fluid.

36. The method of claim 35, further comprising:

depositing a metal layer on the substrate, the deposited metal layer forming reacted and unreacted metal regions, wherein the etching comprises etching at least a portion of the unreacted metal regions.

37. The method of claim 35, wherein the obtaining comprises obtaining a germanium substrate having nickel disposed thereon, and the etching comprises etching at least a portion of the nickel while applying sonic energy to the etching fluid.

38. The method of claim 35, wherein the obtaining comprises obtaining a germanium substrate having nickel disposed on the substrate.

39. The method of claim 35, wherein the applying the sonic energy comprises applying ultrasonic energy.

40. The method of claim 35, wherein the applying sonic energy comprises applying megasonic energy.

41. The method of claim 35, wherein the etching comprises etching without using an oxidant in the etching fluid.

* * * * *